(12) United States Patent
Gleissner et al.

(10) Patent No.: US 10,167,552 B2
(45) Date of Patent: Jan. 1, 2019

(54) SPIN CHUCK WITH ROTATING GAS SHOWERHEAD

(71) Applicant: LAM RESEARCH AG, Villach (AT)

(72) Inventors: Andreas Gleissner, Dobriach (AT); Markus Junk, Villach (AT); Bhaskar Bandarapu, Villach (AT)

(73) Assignee: LAM RESEARCH AG (AT)

( * ) Notice: Subject to any disclaimer, the term of this patent is extended or adjusted under 35 U.S.C. 154(b) by 77 days.

(21) Appl. No.: 14/615,099

(22) Filed: Feb. 5, 2015

(65) Prior Publication Data

US 2016/0230278 A1  Aug. 11, 2016

(51) Int. Cl.
| C23C 16/455 | (2006.01) |
| C23C 16/458 | (2006.01) |
| H01L 21/67 | (2006.01) |

(52) U.S. Cl.
CPC .... *C23C 16/45565* (2013.01); *C23C 16/4584* (2013.01); *C23C 16/45519* (2013.01); *H01L 21/67115* (2013.01)

(58) Field of Classification Search
CPC .......... C23C 16/45565; C23C 16/4584; H01L 21/67051; H01L 21/68728; H01L 21/6708
USPC ........ 134/153, 157, 902, 33, 149, 99.1, 105, 134/34, 104.2, 26, 137; 118/715, 725, 118/730, 724, 52, 728
See application file for complete search history.

(56) References Cited

U.S. PATENT DOCUMENTS

| | | | |
|---|---|---|---|
| 4,903,717 A | 2/1990 | Sumnitsch | |
| 4,960,488 A * | 10/1990 | Law | C23C 16/402 134/1 |
| 5,425,812 A * | 6/1995 | Tsutahara | C23C 16/4412 118/715 |
| 5,513,668 A | 5/1996 | Sumnitsch | |
| 5,871,586 A * | 2/1999 | Crawley | C23C 16/45514 118/715 |
| 6,156,079 A * | 12/2000 | Ho | H01L 21/67115 118/725 |
| 6,374,836 B1 * | 4/2002 | Oroku | B08B 3/04 134/140 |
| 6,423,642 B1 * | 7/2002 | Peace | B08B 3/04 118/900 |
| 6,443,168 B1 * | 9/2002 | Morita | B08B 3/04 134/105 |
| 6,485,531 B1 | 11/2002 | Schob | |

(Continued)

FOREIGN PATENT DOCUMENTS

WO  2007/101764 A1  9/2007

OTHER PUBLICATIONS

Co-pending U.S. Appl. No. 14/145,241, filed Dec. 31, 2013, cited in specification.

*Primary Examiner* — David G Cormier
*Assistant Examiner* — Thomas Bucci

(57) ABSTRACT

An apparatus for processing wafer-shaped articles comprises a spin chuck for holding a wafer-shaped article in a predetermined orientation, and a rotating shower head for supplying process gas to a surface of a wafer-shaped article when held by the spin chuck. The rotating shower head comprises an outlet plate having plural openings formed in each of a central and a peripheral region thereof. A process gas feed is provided so as to supply process gas to a gas distribution chamber. The gas distribution chamber is in fluid communication with a plurality of openings formed in the shower head.

17 Claims, 2 Drawing Sheets

(56) References Cited

U.S. PATENT DOCUMENTS

| | | | |
|---|---|---|---|
| 6,548,411 B2* | 4/2003 | Wirth | B08B 3/04 134/153 |
| 6,632,292 B1* | 10/2003 | Aegerter | C23F 1/18 134/2 |
| 6,680,253 B2* | 1/2004 | Wirth | B08B 3/04 118/900 |
| 6,688,784 B1* | 2/2004 | Templeton | G03D 5/04 134/902 |
| 6,786,996 B2* | 9/2004 | Emami | H01L 21/6708 156/345.1 |
| 6,793,769 B2* | 9/2004 | Kajino | C03C 15/00 134/33 |
| 7,217,325 B2* | 5/2007 | Hanson | H01L 21/32134 118/52 |
| 8,235,062 B2* | 8/2012 | Lauerhaas | H01L 21/67017 134/95.1 |
| 8,382,939 B2* | 2/2013 | Kutney | H01J 37/3244 118/50 |
| 8,387,635 B2* | 3/2013 | Collins | H01L 21/67051 134/153 |
| 8,485,204 B2* | 7/2013 | Obweger | H01L 21/68785 134/104.2 |
| 8,926,788 B2 | 1/2015 | Hohenwarter | |
| 2002/0052097 A1* | 5/2002 | Park | C23C 16/45544 438/507 |
| 2002/0108851 A1* | 8/2002 | Woodruff | H01L 21/288 204/242 |
| 2003/0176067 A1* | 9/2003 | Wirth | B08B 3/04 438/689 |
| 2004/0020599 A1* | 2/2004 | Tanaka | C23C 16/455 156/345.29 |
| 2005/0003600 A1* | 1/2005 | Kasai | C23C 16/14 438/200 |
| 2006/0011298 A1* | 1/2006 | Lim | C23C 16/45514 156/345.34 |
| 2006/0151014 A1* | 7/2006 | Obweger | H01L 21/67051 134/94.1 |
| 2006/0196420 A1* | 9/2006 | Ushakov | C23C 16/45563 118/715 |
| 2007/0110895 A1* | 5/2007 | Rye | H01L 21/67051 427/240 |
| 2007/0119370 A1* | 5/2007 | Ma | C23C 16/18 118/723 E |
| 2007/0137679 A1* | 6/2007 | Rye | C25D 17/06 134/94.1 |
| 2008/0008834 A1* | 1/2008 | Collins | H01L 21/67051 427/282 |
| 2009/0038647 A1* | 2/2009 | DeKraker | H01L 21/67051 134/22.1 |
| 2009/0229754 A1* | 9/2009 | Iizuka | C23C 16/4412 156/345.34 |
| 2009/0236214 A1* | 9/2009 | Janakiraman | C23C 16/45565 204/164 |
| 2010/0126539 A1* | 5/2010 | Lee | H01L 21/67051 134/157 |
| 2010/0151131 A1* | 6/2010 | Obara | C23C 16/4412 427/255.28 |
| 2010/0206481 A1* | 8/2010 | Gigacher | H01L 21/67051 156/345.21 |
| 2010/0294199 A1* | 11/2010 | Tran | C23C 16/4401 118/723 R |
| 2010/0311249 A1* | 12/2010 | White | C23C 16/45565 438/758 |
| 2011/0027480 A1* | 2/2011 | Han | C23C 16/45565 427/248.1 |
| 2011/0059242 A1* | 3/2011 | Brugger | G03F 7/162 427/240 |
| 2011/0148022 A1* | 6/2011 | Brugger | H01L 21/68757 269/296 |
| 2011/0151675 A1* | 6/2011 | Frank | H01L 21/67051 438/748 |
| 2011/0162800 A1* | 7/2011 | Noorbakhsh | C23C 16/45565 156/345.34 |
| 2011/0250044 A1* | 10/2011 | Obweger | H01L 21/683 414/757 |
| 2011/0290283 A1* | 12/2011 | Obweger | H01L 21/68721 134/104.2 |
| 2011/0290419 A1* | 12/2011 | Horiguchi | H01J 37/3244 156/345.29 |
| 2012/0018940 A1* | 1/2012 | Kumnig | H01L 21/68728 269/225 |
| 2012/0027936 A1* | 2/2012 | Gurary | C23C 16/4407 427/255.5 |
| 2012/0145080 A1* | 6/2012 | Park | C23C 16/4412 118/725 |
| 2012/0174866 A1* | 7/2012 | Huh | C23C 16/45559 118/725 |
| 2012/0286481 A1* | 11/2012 | Puggl | H01L 21/6715 279/125 |
| 2012/0305036 A1* | 12/2012 | Lach | H01L 21/67051 134/137 |
| 2012/0309204 A1* | 12/2012 | Kang | H01J 37/3244 438/719 |
| 2013/0048607 A1* | 2/2013 | Matsushita | H01L 21/67028 216/83 |
| 2013/0062839 A1* | 3/2013 | Tschinderle | H01L 21/67051 279/157 |
| 2013/0101372 A1* | 4/2013 | Tschinderle | H01L 21/67126 414/217 |
| 2013/0125379 A1* | 5/2013 | Plazonic | H01L 21/67051 29/559 |
| 2013/0134128 A1* | 5/2013 | Tschinderle | H01L 21/67051 216/58 |
| 2013/0154203 A1* | 6/2013 | Tschinderle | H01L 21/68728 279/33 |
| 2013/0160260 A1* | 6/2013 | Frank | H01L 21/67051 29/25.01 |
| 2013/0233356 A1* | 9/2013 | Obweger | B08B 3/02 134/33 |
| 2013/0309874 A1* | 11/2013 | Kinoshita | H01L 21/67051 438/748 |
| 2014/0026926 A1* | 1/2014 | Semmelrock | H01L 21/67051 134/30 |
| 2014/0041689 A1* | 2/2014 | Namba | H01L 21/02019 134/22.1 |
| 2014/0090599 A1* | 4/2014 | Saitou | B05B 1/005 118/728 |
| 2014/0103145 A1* | 4/2014 | White | H01J 7/32449 239/548 |
| 2014/0130743 A1* | 5/2014 | Toriya | C23C 16/45544 118/725 |
| 2014/0174657 A1* | 6/2014 | Tasaka | H01L 21/67051 156/345.23 |
| 2014/0209027 A1* | 7/2014 | Lubomirsky | B05B 1/005 118/724 |
| 2014/0227884 A1* | 8/2014 | Engesser | H01L 21/6708 438/747 |
| 2014/0283994 A1* | 9/2014 | Gleissner | H01L 21/6708 156/345.23 |
| 2015/0047567 A1* | 2/2015 | Saitou | C23C 16/34 118/729 |
| 2015/0187612 A1* | 7/2015 | Obweger | H01L 21/67109 216/84 |
| 2015/0187629 A1* | 7/2015 | Obweger | B05B 13/0228 118/730 |
| 2015/0206713 A1* | 7/2015 | Amikura | H01J 7/32449 156/345.34 |
| 2015/0211119 A1* | 7/2015 | Ono | C23C 16/45565 118/725 |
| 2015/0225849 A1* | 8/2015 | Kato | C23C 16/4584 438/793 |
| 2016/0010209 A1* | 1/2016 | Hattori | H01J 37/32091 118/723 E |

* cited by examiner

SPIN CHUCK WITH ROTATING GAS SHOWERHEAD

BACKGROUND OF THE INVENTION

1. Field of the Invention

The invention relates generally to an apparatus for processing wafer-shaped articles, such as semiconductor wafers, and more particularly relates to such an apparatus comprising a spin chuck and a rotating gas showerhead.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

It is known to equip such chucks with a gas showerhead so as to introduce a controlled atmosphere adjacent a surface of the wafer undergoing processing on the chuck. Examples of such showerheads are shown in commonly-owned copending application US 2014/0026926 and commonly-owned U.S. Pat. No. 8,926,788. However, depending upon the type of chuck and the type of surrounding structure, it can be difficult to maintain a desired atmosphere and it can also be difficult to utilize process gas efficiently with conventional gas showerheads.

SUMMARY OF THE INVENTION

The present inventors have developed an improved apparatus for treatment of wafer-shaped articles, in which a spin chuck is mounted in relation to a rotating gas showerhead.

Thus, in one aspect, the present invention relates to an apparatus for processing wafer-shaped articles, comprising a spin chuck for holding a wafer-shaped article in a predetermined orientation, and a rotating shower head for supplying process gas to a surface of a wafer-shaped article when held by the spin chuck. The rotating shower head comprises an outlet plate having plural openings formed in each of a central and a peripheral region thereof. A process gas feed is provided so as to supply process gas to a gas distribution chamber. The gas distribution chamber is in fluid communication with a plurality of openings formed in the shower head.

In preferred embodiments of the apparatus according to the present invention, the outlet plate is affixed to the spin chuck and covers a central region thereof.

In preferred embodiments of the apparatus according to the present invention, each of the plural openings has a cross-sectional area in a range from 0.3 to 2.0 mm$^2$, preferably from 0.5 to 1.5 mm$^2$, and more preferably from 0.7 to 1.2 mm$^2$. In preferred embodiments of the apparatus according to the present invention, the plural openings includes at least 50 of the openings, and preferably at least 80 of the openings.

In preferred embodiments there is a plurality of outermost openings arranged in the transition between chuck and outlet plate so that liquid that might be present in the gas distribution chamber will be discharged through such outermost openings.

In preferred embodiments of the apparatus according to the present invention, the plural openings are inclined so as to direct fluid passing from the gas distribution chamber through the plural openings radially outwardly of the spin chuck.

In preferred embodiments of the apparatus according to the present invention, the outlet plate is domed such that a central region thereof is positioned farther from a wafer-shaped article when positioned on the spin chuck than a peripheral region thereof.

In preferred embodiments of the apparatus according to the present invention, the outlet plate is formed of a ceramic material.

In preferred embodiments of the apparatus according to the present invention, the outlet plate is formed in one piece with at least a ring part of the spin chuck.

In preferred embodiments of the apparatus according to the present invention the inwardly facing annular surface of the spin chuck is inclined (upwardly or downwardly) so that liquid adhering thereto will be either upwardly or downwardly transported when the spin chuck spins.

In preferred embodiments of the apparatus according to the present invention, the spin chuck arranged within a chamber.

In preferred embodiments of the apparatus according to the present invention, the chamber is a closed chamber.

In preferred embodiments of the apparatus according to the present invention, the spin chuck is a magnetic rotor, and the apparatus further comprises a magnetic stator surrounding the magnetic rotor.

In another aspect, the present invention relates to an apparatus for processing wafer-shaped articles, comprising a spin chuck for holding a wafer-shaped article in a predetermined orientation, and a rotating shower head for supplying process gas to a surface of a wafer-shaped article when held by the spin chuck. A process gas feed is provided so as to supply process gas to a gas distribution chamber. The gas distribution chamber is in fluid communication with a plurality of openings formed in the shower head. The spin chuck is a magnetic rotor, and the apparatus further comprises a magnetic stator surrounding the magnetic rotor.

In preferred embodiments of the apparatus according to the present invention, the rotating shower head comprises an outlet plate having discharge openings formed therein, the outlet plate being affixed to the magnetic rotor and covering a central region thereof.

In preferred embodiments of the apparatus according to the present invention, the outlet plate is domed such that a central region thereof is positioned farther from a wafer-shaped article when positioned on the spin chuck than a peripheral region thereof.

In preferred embodiments of the apparatus according to the present invention, the spin chuck is arranged within a closed chamber comprising a top wall having a peripheral region positioned above the magnetic rotor and a central region that extends downwardly within the magnetic rotor, and wherein an inner surface of the top wall and the outlet plate define the gas distribution chamber.

In preferred embodiments of the apparatus according to the present invention, the top wall is stationary.

In preferred embodiments of the apparatus according to the present invention, a blocking gas feed is provided so as to supply blocking gas to a gap defined between a peripheral surface of the magnetic rotor and an inner surface of the chamber, the gap being positioned so as to confine process gas within the gas distribution chamber.

In preferred embodiments of the apparatus according to the present invention, a gas injection head is positioned in the top wall and passing through a central opening in the outlet plate.

In preferred embodiments of the apparatus according to the present invention, the rotating shower head comprises a central opening through which liquid can be supplied towards the wafer shaped article.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
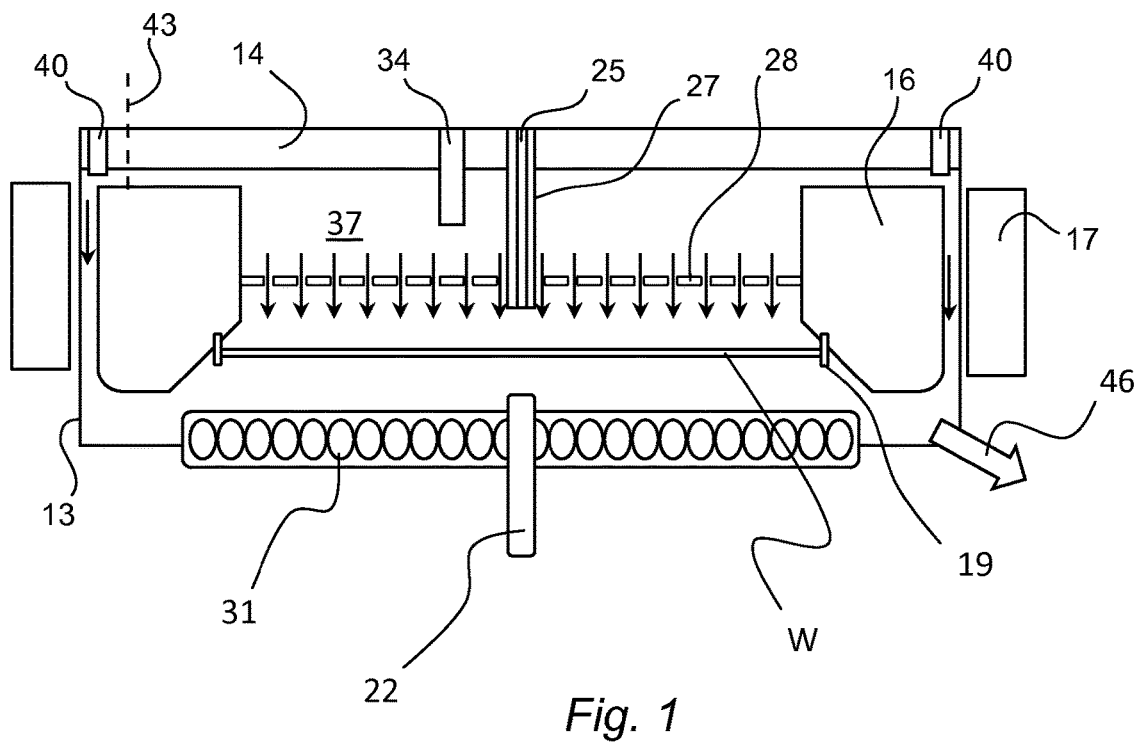
FIG. 1 is an explanatory cross-sectional side view of an apparatus according to a first embodiment of the invention.

Referring now to FIG. 1, an apparatus for treating surfaces of wafer-shaped articles according to a first embodiment of the invention comprises a closed process chamber 13, in which is arranged an annular spin chuck 16. Spin chuck 16 is a magnetic rotor that is surrounded by a magnetic stator 17 positioned outside the chamber, so that the magnetic rotor is freely rotating and levitating within the chamber 13 without touching the chamber walls. The chamber 13 is closed at its upper end by lid 14 rigidly secured thereto.

Further structural details of such a magnetic rotor chuck are described, for example, in commonly-owned U.S. patent application publication no. 2013/0134128.

The annular spin chuck 16 has a circular series of downwardly-depending gripping pins 19, which releasably hold a wafer W during processing. A lower dispense unit 22 is provided so as to supply liquid and/or gas to the side of the wafer W that faces downwardly within chamber 13. A heater 31 is disposed within the chamber 13, so as to heat the wafer W to a desired temperature depending upon the process being performed. Heater 31 preferably comprises a multitude of blue LED lamps, whose radiation output tends to be absorbed preferentially by silicon wafers relative to the components of the chamber 13.

An upper dispense unit comprises an outer gas conduit 27 and an inner liquid conduit 25 arranged coaxially within the outer gas conduit 27. Conduits 25, 27 both traverse the lid 14, and permit liquid and gas to be supplied to the side of the wafer W that faces upwardly within chamber 13.

Figure 2:
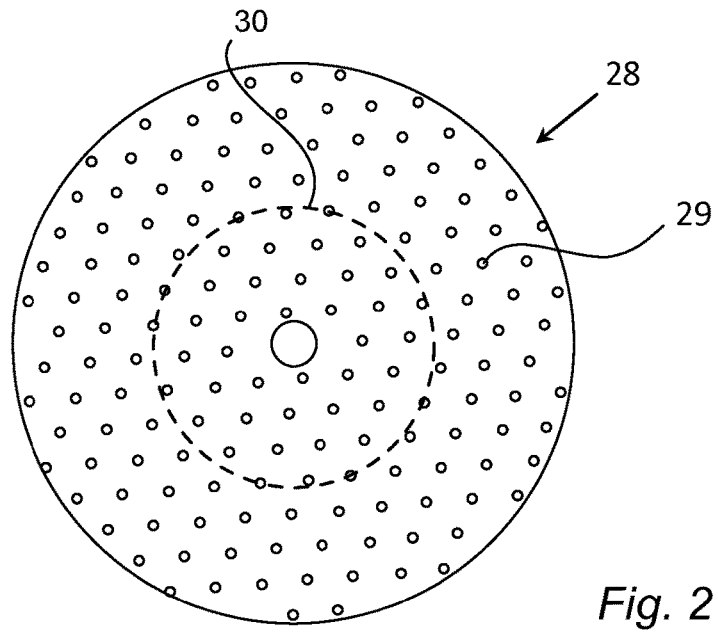
FIG. 2 is a plan view of the outlet plate of the gas showerhead used in the embodiment of FIG. 1.

A gas showerhead is delimited at its lower side by an outlet plate 28, which is also shown in plan view in FIG. 2. The outlet plate 28 comprises a multitude of discharge orifices 29, which permit process gas to pass out of the gas showerhead from the gas distribution chamber 37 to the region adjacent the upwardly facing side of the wafer W. The discharge orifices 29 in this embodiment each have a cross-sectional area in a range from 0.3 to 2.0 mm, preferably from 0.5 to 1.5 mm, and more preferably from 0.7 to 1.2 mm. There are preferably at least 20 orifices 29, and more preferably at least 80; even more preferably 300.

The outlet plate 28 is rigidly secured to the spin chuck 16, and therefore rotates along with the spin chuck 16. On the other hand, the conduits 25, 27 are stationarily mounted in the lid 14 of chamber 13, and pass with a slight clearance through a central opening formed in the plate 28.

As shown in FIG. 2, there are a plurality of these orifices 29 in each of a central region and a peripheral region of the plate 28, wherein the central region is defined as being the area within the half-radius 30 of the plate 28, and the peripheral region is defined as being the area outside of the half-radius 30.

Returning to FIG. 1, it will be seen that the gas distribution chamber 37 is supplied with process gas through a process gas supply conduit 34, which in turn communicates with a source of process gas (not shown), which in preferred embodiments is ozone.

The lid 14 of chamber 13 is also traversed by one or more nozzles 40 that are supplied with purge, or blocking, gas, which in this embodiment is preferably nitrogen gas. A more detailed description of possible constructions of a lid incorporating such nozzles is set forth in commonly-owned copending published application US 2013/0134128, as well as in commonly-owned copending application Ser. No. 14/145,241.

The blocking gas supplied through nozzles 40 performs an important function in this embodiment, in that it serves to confine the process gas within the gas distribution chamber such that the process gas delivered through the one or more nozzles 34 passes more completely through the orifices 29 of plate 28, and is largely prevented from escaping through the annular gap between the outer periphery of chuck 16 and the inner surface of chamber wall 13.

On the other hand, experiments conducted by the inventors had shown that, in the absence of supplying such blocking gas, a large proportion of the process gas, in some instances a majority thereof, escaped through the gap between the outer periphery of the magnetic rotor and the chamber wall, such that the process gas was exhausted from the chamber through exhaust 46 without having been brought into contact with the upwardly-facing side of the wafer W.

The dashed line 43 in FIG. 1 shows the approximate location of the boundary formed between the process gas and the blocking gas thanks to the structure shown in this embodiment. The provision of a gas-gas boundary to confine the process gas within the distribution chamber 37 is an innovative solution in the context of a magnetic rotor chuck, which does not contact the chamber in which it is mounted and which therefore cannot be equipped with conventional gas seals.

Figure 3:
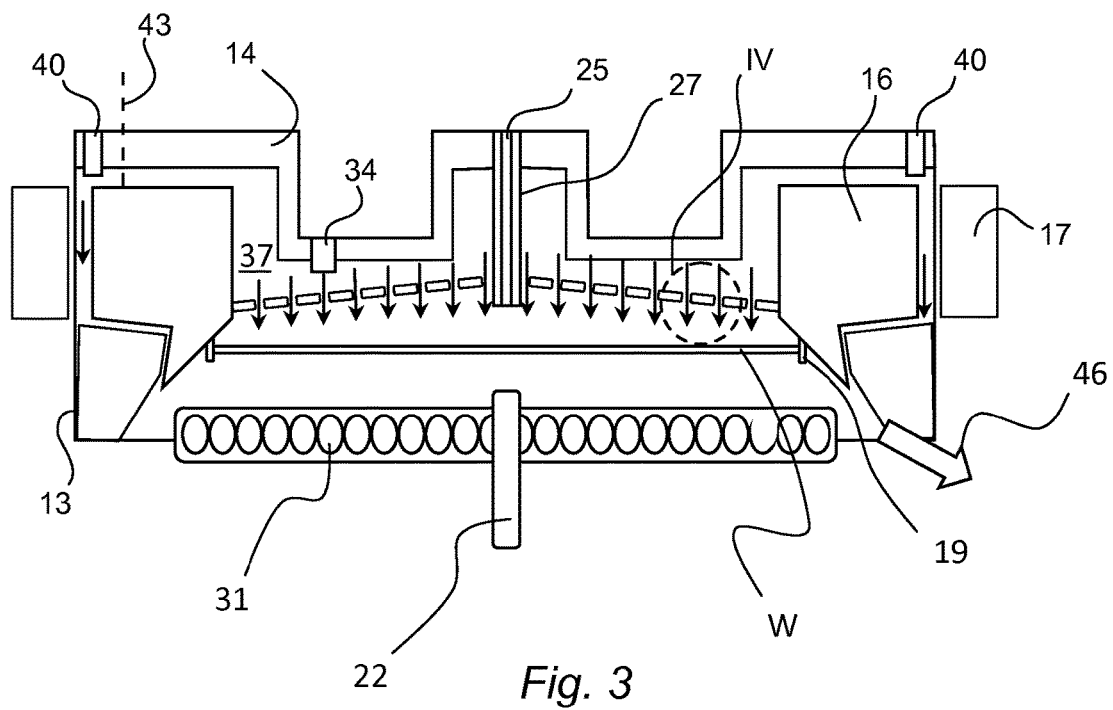
FIG. 3 is an explanatory cross-sectional side view of an apparatus according to a second embodiment of the invention.
Figure 4:
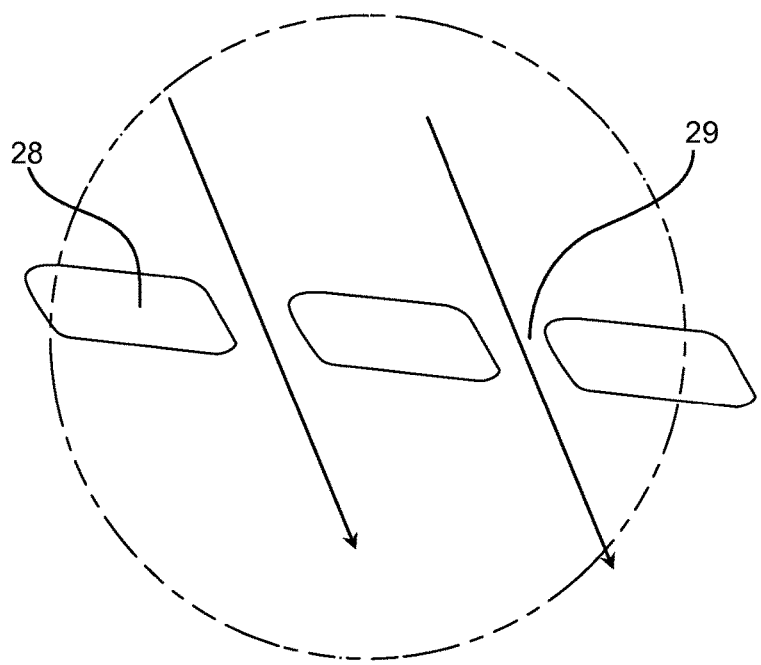
FIG. 4 is an enlarged view of the detail IV in FIG. 3.

Turning now to FIGS. 3 and 4, another embodiment of the invention is shown that includes several features that were found to further improve the efficiency of the process gas supply through chamber 37 and into the target region adjacent the upwardly facing side of the wafer W.

Specifically, the outlet plate 28 in the FIGS. 3 and 4 embodiment is domed upwardly, such that its central region is more distant from the wafer W than its peripheral region. Conversely, the lid 14 of the chamber 13 is reconfigured, such that an intermediate region thereof extends downwardly into the region surrounded by the magnetic rotor 16. The axial extent of the gas distribution chamber 37 is thereby significantly reduced relative to the embodiment of FIGS. 1 and 2, which the inventors have found further improves the efficiency of process gas supply.

Additionally, as shown in FIG. 3, the discharge orifices 29 of this embodiment are oriented at an oblique angle relative to the vertical axis of rotation of the spin chuck 16, such that the orifices are directed radially outwardly of the spin chuck 16. The inventors have found that this configuration helps to divert any liquids in the distribution chamber 37 away from the upwardly facing surface of wafer W, while permitting the process gas supplied through conduit 34 still to reach the target region adjacent the wafer W.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. An apparatus for processing wafer-shaped articles, comprising:
    a closed process chamber;
    a spin chuck for holding a wafer-shaped article in a predetermined orientation, said spin chuck including a plurality of downwardly-depending gripping pins arranged in a circular series and disposed within the closed process chamber,
    a rotating shower head included within an upper dispense unit for supplying process gas to a first surface of a wafer-shaped article when held by said plurality of downwardly-depending gripping pins, said rotating shower head comprising an outlet plate having a plurality of openings formed in each of a central and a peripheral region thereof,
    a process gas feed for supplying process gas to a gas distribution chamber defined within the closed process chamber, said gas distribution chamber being in fluid communication with said plurality of openings formed in said rotating shower head, and
    a blocking gas feed for supplying blocking gas to a gap defined between an inner surface of said closed process chamber and an outer periphery of said spin chuck to confine process gas within said gas distribution chamber,
    wherein each of said plurality of downwardly-depending gripping pins is configured to retain said wafer-shaped article such that a second surface of said wafer-shaped article is oriented with respect to a lower dispense unit.

2. The apparatus according to claim 1, wherein said outlet plate is affixed to said spin chuck and covers a central region thereof.

3. The apparatus according to claim 1, wherein the outlet plate is formed in one piece with at least a ring part of the spin chuck.

4. The apparatus according to claim 1, wherein each of said plurality of openings has a cross-sectional area in a range from 0.3 to 2.0 mm$^2$.

5. The apparatus according to claim 1, wherein said plurality of openings includes at least 50 of said openings.

6. The apparatus according to claim 1, wherein said plurality of openings are inclined so as to direct fluid passing from said gas distribution chamber through said plurality of openings radially outwardly of said spin chuck.

7. The apparatus according to claim 1, wherein said outlet plate is domed such that a central region thereof is positioned farther from a wafer-shaped article when positioned on said spin chuck than a peripheral region thereof.

8. The apparatus according to claim 1, wherein said outlet plate is formed of a ceramic material.

9. The apparatus according to claim 1, wherein said spin chuck is a magnetic rotor, said apparatus further comprising a magnetic stator surrounding said magnetic rotor.

10. The apparatus according to claim 1, wherein said gap comprises an annular gap between said inner surface of said closed process chamber and said outer periphery of said spin chuck to confine process gas within said gas distribution chamber.

11. An apparatus for processing wafer-shaped articles, comprising:
    a closed process chamber,
    a spin chuck disposed within the closed process chamber, the spin chuck for holding a wafer-shaped article in a predetermined orientation, said spin chuck including a plurality of downwardly-depending gripping pins arranged in a circular series,
    a rotating shower head disposed within the closed process chamber for supplying process gas to a first surface of a wafer-shaped article when held by said plurality of downwardly-depending gripping pins, said rotating shower head comprising a domed outlet plate defining a plurality of openings in each of a central region and a peripheral region thereof such that said central region is positioned farther from said first surface than said peripheral region, and
    a process gas feed for supplying process gas to a gas distribution chamber defined within said closed process chamber, said gas distribution chamber being in fluid communication with said plurality of openings,
    wherein said spin chuck is a magnetic rotor, said apparatus further comprising a magnetic stator surrounding said magnetic rotor.

12. The apparatus according to claim 11, wherein said closed process chamber comprises a top wall having a peripheral region positioned above said magnetic rotor and a central region that extends downwardly within said magnetic rotor, and wherein an inner surface of said top wall and said domed outlet plate define said gas distribution chamber.

13. The apparatus according to claim 12, wherein the top wall is stationary.

14. The apparatus according to claim 11, further comprising a blocking gas feed for supplying blocking gas to a gap defined between a peripheral surface of said spin chuck and an inner surface of said closed process chamber, said gap being positioned so as to confine process gas within said gas distribution chamber.

15. The apparatus according to claim 11, further comprising a gas injection head positioned in a top wall of said closed process chamber and passing through a central opening in said domed outlet plate.

16. The apparatus according to claim 11, wherein the rotating shower head comprises a central opening through which liquid can be supplied towards the wafer-shaped article.

17. The apparatus according to claim 14, wherein said gap comprises an annular gap between said inner surface of said closed process chamber and said peripheral surface of said spin chuck to confine process gas within said gas distribution chamber.

* * * * *